(12) United States Patent
Sheppard

(10) Patent No.: US 7,875,914 B2
(45) Date of Patent: Jan. 25, 2011

(54) SWITCH MODE POWER AMPLIFIER USING MIS-HEMT WITH FIELD PLATE EXTENSION

(75) Inventor: Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/474,570

(22) Filed: May 29, 2009

(65) Prior Publication Data
US 2009/0237160 A1    Sep. 24, 2009

Related U.S. Application Data

(63) Continuation of application No. 11/187,171, filed on Jul. 21, 2005, now Pat. No. 7,548,112.

(51) Int. Cl.
H01L 29/72    (2006.01)
(52) U.S. Cl. .............. 257/289; 257/401; 257/622; 257/630; 330/257
(58) Field of Classification Search .......... 257/289, 257/401, 622, 630; 330/257
See application file for complete search history.

(56) References Cited

U.S. PATENT DOCUMENTS

| | | | |
|---|---|---|---|
| 5,187,580 A * | 2/1993 | Porter et al. ........... 330/207 A |
| 5,939,941 A * | 8/1999 | Nair et al. ............. 330/251 |
| 6,724,255 B2 * | 4/2004 | Kee et al. ............. 330/251 |
| 7,236,053 B2 * | 6/2007 | Pribble et al. .......... 330/251 |
| 2003/0020092 A1 | 1/2003 | Parikh et al. |
| 2004/0137673 A1 * | 7/2004 | Passlack et al. ......... 438/197 |
| 2005/0051796 A1 * | 3/2005 | Parikh et al. ........... 257/192 |
| 2005/0051800 A1 | 3/2005 | Mishra et al. |
| 2005/0245037 A1 * | 11/2005 | Shin ................... 438/287 |

FOREIGN PATENT DOCUMENTS

EP    1 843 390 A1    10/2007

OTHER PUBLICATIONS

U.S. Appl. No. 10/958,970, filed Oct. 4, 2004.
U.S. Appl. No. 10/976,422, filed Oct. 29, 2004.
U.S. Appl. No. 10/958,945, filed Oct. 4, 2004.
U.S. Appl. No. 11/078,265, filed Mar. 11, 2005.
U.S. Appl. No. 11/132,619, filed May 18, 2005.
International Search Report and Written Opinion; PCT/US06/28370; Jan. 28, 2008.
Office Action corresponding to European Application No. 06788110.2 mailed Sep. 9, 2009, (9 pages).

(Continued)

*Primary Examiner*—Edward Wojciechowicz
(74) *Attorney, Agent, or Firm*—Myers Bigel Sibley & Sajovec

(57) ABSTRACT

Disclosed are a switch mode power amplifier and a field effect transistor especially suitable for use in a switch mode power amplifier. The transistor is preferably a compound high electron mobility transistor (HEMT) having a source terminal and a drain terminal with a gate terminal therebetween and positioned on a dielectric material. A field plate extends from the gate terminal over at least two layers of dielectric material towards the drain. The dielectric layers preferably comprise silicon oxide and silicon nitride. A third layer of silicon oxide can be provided with the layer of silicon nitride being positioned between layers of silicon oxide. Etch selectivity is utilized in etching recesses for the gate terminal.

20 Claims, 2 Drawing Sheets

OTHER PUBLICATIONS

Wang et al. "High Temperature Performance and Low Frequency Noise Characteristics of AlGaN/GaN/AlGaN Double Heterostructure Metal-Oxide-Semiconductor Heterostructure Field-Effect-Transistors with Photochemical Vapor Deposition $SiO_2$ Layer" *Japanese Journal of Applied Physics* 44(4B):2458-2461 (2005).

* cited by examiner

SWITCH MODE POWER AMPLIFIER USING MIS-HEMT WITH FIELD PLATE EXTENSION

CROSS REFERENCE TO RELATED APPLICATIONS

This application is a continuation of application Ser. No. 11/187,171 filed Jul. 21, 2005 now U.S. Pat. No. 7,548,112 which is related to co-pending application Ser. No. 11/132,619, assigned to the present assignee, which is incorporated herein by reference for all purposes. This application is related to the following co-pending applications: U.S. Patent Publication No. US20050051796A1, entitled "WIDE BANDGAP TRANSISTOR DEVICES WITH FIELD PLATES"; U.S. Patent Publication No. US20050051800A1, entitled "CASCODE AMPLIFIER STRUCTURES INCLUDING WIDE BAND GAP FIELD EFFECT TRANSISTOR WITH FIELD PLATE"; U.S. patent application Ser. No. 10/958,970, filed Oct. 4, 2004, entitled "WIDE BAND GAP FIELD EFFECT TRANSISTORS WITH FIELD PLATES"; U.S. patent application Ser. No. 10/976,422, filed Oct. 29, 2004, entitled "WIDE BAND GAP FIELD EFFECT TRANSISTOR WITH DUAL FIELD PLATES"; U.S. patent application Ser. No. 10/958,945, filed Oct. 4, 2004, entitled "WIDE BAND GAP FIELD EFFECT TRANSISTORS WITH SOURCE CONNECTED FIELD PLATES"; and U.S. patent application Ser. No. 11/078,265, filed Mar. 11, 2005, entitled "WIDE BAND GAP FIELD EFFECT TRANSISTORS WITH GATE-SOURCE FIELD PLATES", all of which are incorporated herein by reference for all purposes.

BACKGROUND OF THE INVENTION

This invention relates generally to power amplifiers, and more particularly the invention relates to switch-mode power amplifiers and transistors useful therein.

Switch mode power amplifiers have attracted a significant amount of interest for use in applications requiring highly efficient power amplification of high frequency signals. Examples of applications of such devices include power amplifiers for wireless communications systems, satellite communications systems, and advanced radar systems. In particular, high power, high frequency power amplifiers are needed for digital communication systems such as 3G and 4G PCS systems, WiFi, WiMax and digital video broadcast systems. For applications requiring high output power, the power amplifier accounts for a significant portion of the overall power consumed by the system. Thus, it is desirable to maximize the efficiency of the power amplifier circuit in a communication system.

Co-pending application Ser. No. 11/132,619, supra, discloses a single-stage switch mode amplifier circuit which includes an active device switch transistor configured to operate in either an ON state or an OFF state depending on the signal level of an input signal. The switch transistor has an output connected to a load network which filters the signal output from the switch transistor to provide a narrow-bandwidth output signal to a load impedance. Energy rejected by the load network is stored in a switch capacitor which continues to drive the output signal while the switch transistor is in the OFF state. Drain voltage to the switch transistor is provided through a drain inductor which prevents instantaneous changes in source current. In some embodiments, the amplifier operates in Class E mode.

In some embodiments, a switch mode amplifier circuit includes an input matching stage, an active stage and an output matching stage. The active stage includes an active device switch transistor in parallel with a switch capacitor. The switch transistor has an output connected to a load network and a load impedance. The output of the device, which comprises the voltage across the load impedance, is supplied to the output matching stage, which transforms the output impedance of the active stage to the desired output impedance of the circuit. In other embodiments, multiple active transistor stages and matching networks may be used to provide additional amplifier gain (e.g. 2-stage amplifiers, etc.)

The switch transistor can comprise a wide bandgap MESFET transistor capable of sustaining high drain voltages and/or high current levels while operating at frequencies in excess of 1.0 GHz. In some embodiments, the switch transistor comprises a gallium nitride (GaN) based high electron mobility transistor (HEMT). In some embodiments, the switch transistor comprises a GaN based HEMT having a total gate periphery of about 3.6 mm. In some embodiments, the switch transistor comprises a GaN MESFET. In other embodiments, the switch transistor comprises a different wide bandgap high frequency transistor, such as a SiC MESFET, SiC LDMOS, SiC bipolar transistor, or GaN MOSFET device.

Switch mode operation of field effect transistors in an amplifier requires robust operation at microwave frequencies under high compression. In practice, this is difficult to realize due to the very large forward currents that flow from gate to source under high input drive as needed for switch mode operation.

SUMMARY OF THE INVENTION

The invention is directed to a field effect transistor which can be used in a switch mode power amplifier with more robust operation under high compression.

More particularly, the transistor is a high electron mobility transistor (HEMT) which includes a gate dielectric to limit forward conduction from gate to source under high input drive and suppress gate leakage during high-voltage, high-temperature operation.

Further, a gate field plate extension can be provided to shape the peak electric field with minimum impact on added gate capacitance. Two or more dielectric layers can be employed under the field plate and provide a thicker dielectric to minimize impact on gate capacitance.

In accordance with a feature of the invention, etch selectivity between the two different insulators can be employed in fabricating the gate electrode.

The invention and objects and features thereof will be more readily apparent from the following detailed description and appended claims when taken with the drawings.

DETAILED DESCRIPTION

Figure 1:
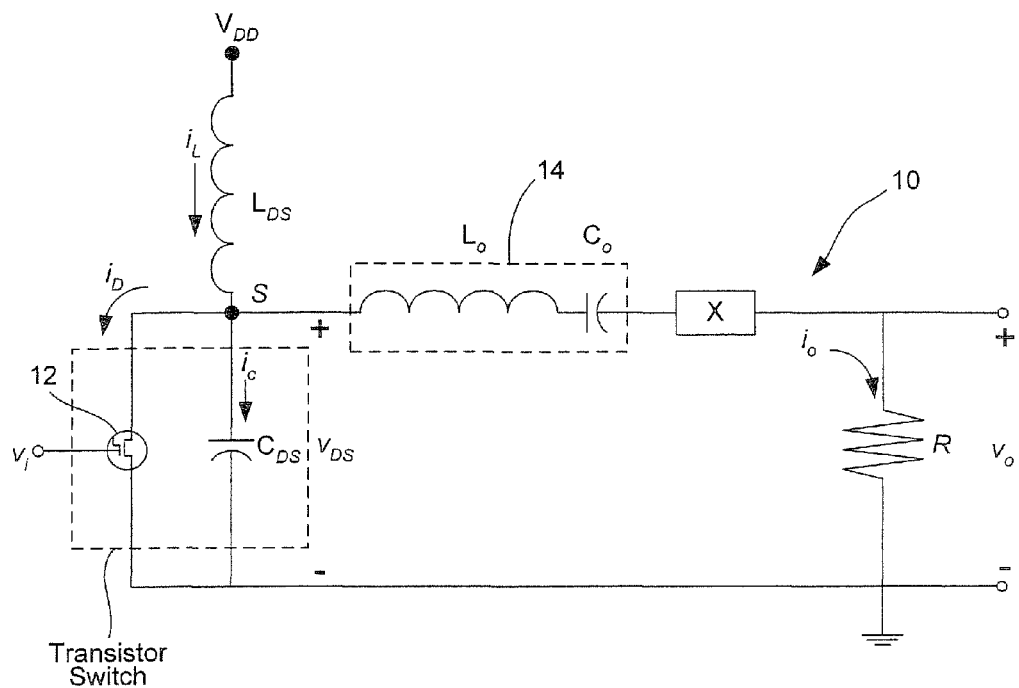
FIG. 1 is a schematic of one embodiment of a switch mode power amplifier in accordance with the invention.

Referring now to FIG. 1, a single-stage switch mode power amplifier circuit model 10 in accordance with an embodiment of the invention is illustrated. Amplifier 10 includes a metal-insulator-semiconductor transistor 12 comprising a wide bandgap transistor which functions as an on/off switch. The use of an insulator separating the gate from the semiconductor body limits forward conduction from gate to source under high stress drive, in some embodiments. The transistor 12 comprises a GaN HEMT. Transistor 12 may alternatively comprise a different wide bandgap high-frequency transistor, such as a SiC MESFET, GaN MESFET, SiC LDMOS, SiC bipolar transistor, or GaN MOSHFET device.

An input voltage signal vi is applied to the gate of transistor 12, which controls the state of the transistor 12. The input voltage signal vi is biased close to the pinch-off voltage of the transistor 12. The drain of the transistor 12 is coupled to an output node S, and the source of transistor 12 is coupled to ground. A supply voltage VDD is coupled to output node S via an inductor LDS. The voltage at output node S is applied to a series resonant circuit 14 which comprises an inductor $L_o$ and a capacitor $C_o$. In some applications, the series resonant circuit 14 may be a bandpass circuit tuned to pass a narrow range of frequencies centered on the desired output frequency $f_o$ of the amplifier circuit 10. In other applications such as radar applications, the series resonant circuit may be tuned to pass a broader range of frequencies. At the output frequency, the transistor output is presented with a load equal to R+jX, where X is the reactance of the resonant circuit seen at the output.

When the transistor 12 is in the on state (i.e. the transistor is saturated), the device acts as a short circuit to ground, pulling the voltage at node S to zero. Current through the inductor $L_{DS}$ then increases linearly. When the transistor is turned off, the current through $L_{DS}$ is steered into the drain-source capacitance $C_{DS}$, causing the voltage at node S to rise until it reaches a maximum, at which point the voltage at node S begins to decrease as the drain-source capacitance $C_{DS}$ begins to source current back to the load. The resonant circuit 14 is tuned such that in steady state, the voltage at node S returns to approximately zero before the transistor is turned on again.

The resonant circuit 14 ideally passes only the fundamental frequency of the voltage at node S. The input voltage $v_i$ may carry modulated frequency or phase information that is present in the amplified output signal.

Figure 2:
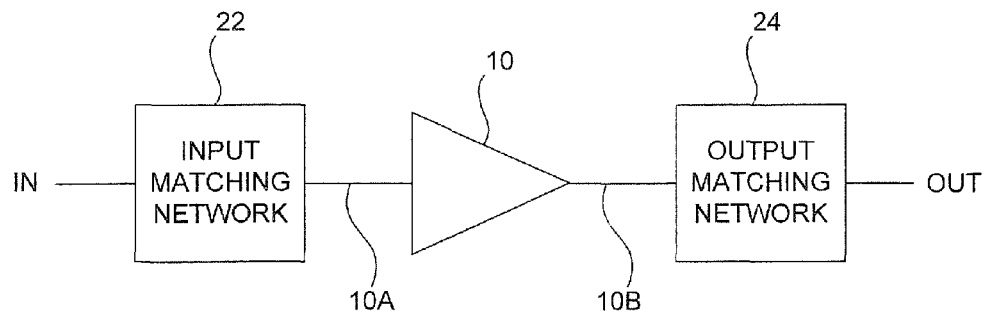
FIG. 2 is a functional block diagram of a switch mode power amplifier in accordance with the invention.

As illustrated in FIG. 2, an amplifier circuit 20 may include a Class E amplifier 10 having an input 10A and an output 10B. An input matching network 22 is coupled to the input 10A and an output matching network 24 is coupled to the output 10B of the amplifier 10. The input matching network 22 matches the impedance seen by the input signal $v_i$ to the input impedance of the amplifier 10, while the output matching network 24 transforms the output impedance of the amplifier 10 to a desired output impedance, e.g. 50 ohms.

Figure 3:
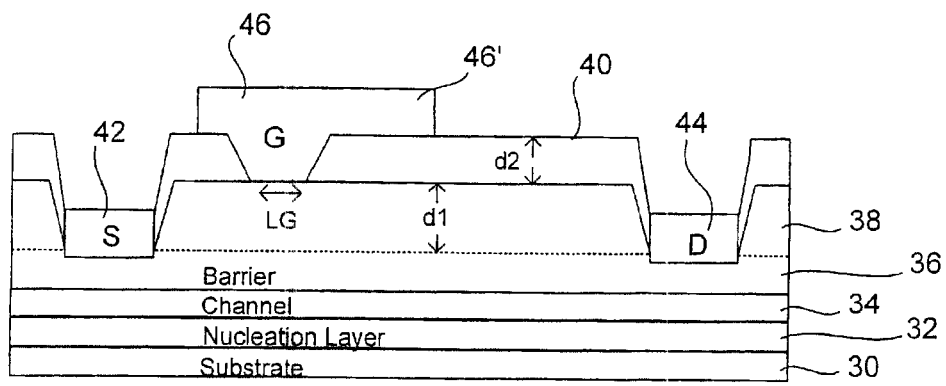
FIG. 3 is a section view of a high electron mobility transistor (HEMT) useful in the switch mode power amplifier in accordance with an embodiment of the invention.
Figure 4:
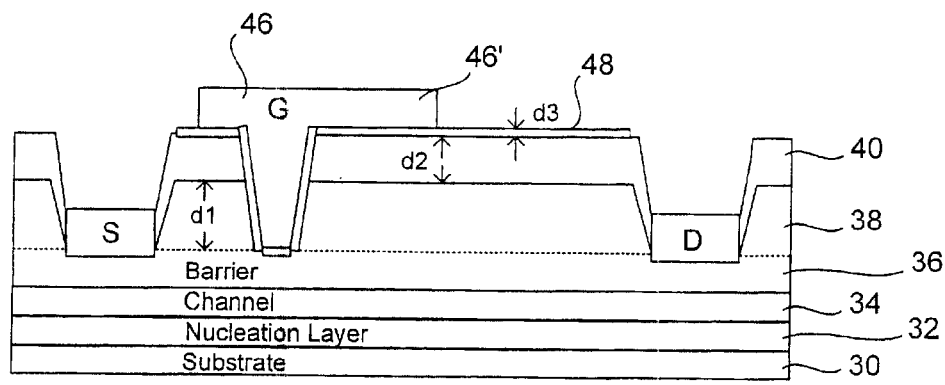
FIG. 4 is a section view of a HEMT useful in the switch mode power amplifier in accordance with another embodiment of the invention.

Referring now to FIGS. 3 and 4, two embodiments of field effect transistors in accordance with the invention are illustrated in cross section.

In FIG. 3, the transistor includes a structure which can be similar to the structure described in application Ser. No. 11/132,619, supra. For example. substrate 30 can be silicon carbide, buffer or nucleation layer 32 can be AlGaN or GaN, channel layer 34 can be InAlGaN, GaN or AlGaN, and barrier layer 36 can be a group III nitride. As described in application Ser. No. 11/132,619, buffer layer 32 on the substrate 30 provides an appropriate crystalline transition between the substrate 30 and the remainder of the device. Buffer layer 32 may include one or more layers of InAlGaN. In particular embodiments, buffer layer 32 may include GaN, AlN or AlGaN. Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Exemplary HEMT structures are illustrated in U.S. Pat. Nos. 6,316,793, 6,586,781 6,548,333 5,192,987 and 5,296,395 and U.S. Published Patent Application Nos. 2002/0167023 and 2003/0020092 each of which is incorporated by reference as though fully set forth herein.

Although semi-insulating silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In addition, the substrate may be conductive, semi-insulating or highly resistive. In embodiments comprising a MMIC, it is desirable to use a semi-insulating or highly resistive substrate. In some embodiments, an appropriate buffer layer also may be formed.

Provided on barrier layer 36 is a first dielectric layer 38 with a second dielectric layer 40 on dielectric layer 38. Contact holes are etched through layers 38, 40 for a source contact 42 and a drain contact 44. A preferential etchant can be used to etch only dielectric 40 with a gate contact 46 formed on gate dielectric 38. For example, dielectric 38 can be silicon oxide and dielectric 40 can be silicon nitride. Alternatively, the two dielectric layers can be the same material which is deposited or formed at different times in the process to form two layers. Other known barrier layer materials can be employed, also.

In accordance with a feature of the invention, gate contact 46 can be extended over dielectric layer 40 towards the drain, as shown at 46' to form a field plate extension. The field plate extension of the gate electrode towards the drain over the thicker dielectric can be designed to shape the peak electric field with minimum impact on increased gate capacitance. The use of a field plate in other applications is known.

FIG. 4 illustrates in cross-section another embodiment of a field effect transistor in accordance with the invention. Here, the substrate 30 and layers 32-36 can be the same as in FIG. 3. However, in this embodiment three dielectric layers are employed including layers 38 and 40 as in FIG. 3 along with a third dielectric layer 48. Here the gate contact opening is etched through both dielectric layers 38, 40 and then the third dielectric is deposited in the gate opening. Gate metallization is then deposited on the stacked dielectric to form gate electrode 46, which can have a shorter gate length, $L_G$, and lower capacitance than other structures.

In FIGS. 3 and 4, dielectric 38 has a thickness d1, dielectric 40 has a thickness d2, and dielectric 48 has a thickness, d3. The thicknesses, d1, d2, and d3 are optimized to reliably support $V_{GD}$, maintain frequency response, and minimize $C_{gd}$ and $C_{gs}$. Gate length, $L_G$, is tuned for the operational frequency of interest. In FIG. 4 dielectrics 38 and 40 can be $SiO_2$ and SiN or the same material, as in FIG. 3, and dielectric layer 48 can be $SiO_2$. For maximum benefit, the top and bottom dielectrics should be of higher bandgap than the middle dielectric.

Novel use of this device in a switch-mode amplifier enables reliable operation because it avoids large detrimental forward gate current during the part of the cycle that the transistor is on.

Published U.S. 2003/0020092A1 discloses metal contacts and insulating gate structures that can be employed in practicing the invention. Thus, while the invention has been described with reference to specific embodiments, the description is illustrative of the invention and is not to be construed as limiting the invention. Various modifications and applications may occur to those skilled in the art without departing from the true scope and spirit of the invention as defined by the appended claims.

That which is claimed is:

1. A switch mode power amplifier, comprising:
    a signal input terminal;
    a power terminal;
    a ground terminal,
    a resonant circuit coupling the drain terminal to an output terminal, the resonant circuit configured to provide a bandpass filter that passes a desired output frequency $f_0$,
    a resistance coupling the output terminal to the ground terminal, and
    a field effect transistor including a channel layer, a barrier layer on the channel layer wherein the barrier layer and the channel layer are configured to generate a two-dimensional electron gas (2DEG) at an interface therebetween, at least two dielectric layers over the barrier layer, source and drain electrodes contacting the barrier layer and coupled to the ground terminal and the power terminal respectively, and a gate electrode coupled to the signal input terminal and positioned on the at least two dielectric layers between the source and drain electrodes wherein at least one of the at least two dielectric layers is between the gate electrode and the barrier layer and wherein the gate electrode is isolated from the barrier layer by the at least one of the at least two dielectric layers.

2. The switch mode power amplifier as defined by claim 1, wherein the field effect transistor further includes a field plate extension from the gate electrode over the at least two dielectric layers towards the drain terminal.

3. The switch mode power amplifier as defined by claim 2 wherein the at least two dielectric layers comprise silicon oxide and silicon nitride.

4. The switch mode power amplifier as defined by claim 3 wherein the at least two dielectric layers includes a third dielectric layer comprising silicon oxide, the layer of silicon nitride being between the two layers of silicon oxide.

5. The switch mode power amplifier as defined by claim 3 wherein the channel layer and the barrier layer comprise a semiconductor material selected from the group consisting of periodic table group III nitrides.

6. The switch mode power amplifier as defined by claim 5 further comprising a substrate and a buffer layer on the substrate, wherein the barrier layer and the channel layer are on the buffer layer.

7. The switch mode power amplifier as defined by claim 6 wherein the substrate comprises silicon carbide, the buffer layer comprises InAlGaN, GaN, AlGaN or AlN, the channel layer comprises InGaN, InAlGaN, GaN or AlGaN, and the barrier layer comprises a first group III nitride.

8. The switch mode power amplifier as defined by claim 2 wherein the channel layer and the barrier layer comprise a semiconductor material selected from the group consisting of periodic table group III nitrides.

9. The switch mode power amplifier as defined by claim 8 further comprising a substrate and a buffer layer on the substrate, wherein the barrier layer and the channel layer are on the buffer layer.

10. The switch mode power amplifier as defined by claim 9 wherein the substrate comprises silicon carbide, the buffer layer comprises InAlGaN, GaN, AlGaN or AlN, the channel layer comprises InGaN, InAlGaN, GaN or AlGaN, and the barrier layer comprises a first group III nitride.

11. A field effect transistor for use in a switch mode power amplifier, the field effect transistor comprising:
    a) a channel layer,
    b) a barrier layer on the channel layer wherein the barrier layer and the channel layer are configured to generate a two-dimensional electron gas (2DEG) at an interface therebetween,
    c) at least two dielectric layers over the barrier layer,
    d) source and drain electrodes contacting the barrier layer, and
    e) a gate electrode positioned on the at least two dielectric layers between the source and drain electrodes wherein at least one of the at least two dielectric layers is between the gate electrode and the barrier layer and wherein the gate electrode is isolated from the barrier layer by the at least one of the at least two dielectric layers.

12. The field effect transistor as defined by claim 11 and further including: h) a field plate extension from the gate electrode over the at least two dielectric layers towards the drain terminal.

13. The field effect transistor as defined by claim 12 wherein the at least two dielectric layers in c) comprise silicon oxide and silicon nitride.

14. The field effect transistor as defined by claim 13 wherein c) includes a third dielectric layer comprising silicon oxide, the layer of silicon nitride being between the two layers of silicon oxide.

15. The field effect transistor as defined by claim 13 wherein the channel layer and the barrier layer comprise a semiconductor material selected from the group consisting of periodic table group III nitrides.

16. The field effect transistor as defined by claim 15 further comprising a substrate and a buffer layer on the substrate, wherein the barrier layer and the channel layer are on the buffer layer.

17. The field effect transistor as defined by claim 16 wherein the substrate comprises silicon carbide, the buffer layer comprises InAlGaN, GaN, AlGaN or AlN, the channel layer comprises InGaN, InAlGaN, GaN or AlGaN, and the barrier layer comprises a first group III nitride.

18. The field effect transistor as defined by claim 12 wherein the channel layer and the barrier layer comprise a semiconductor material selected from the group consisting of periodic table group III nitrides.

19. The field effect transistor as defined by claim 18 further comprising a substrate and a buffer layer on the substrate, wherein the barrier layer and the channel layer are on the buffer layer.

20. The field effect transistor as defined by claim 19 wherein the substrate comprises silicon carbide, the buffer layer comprises InAlGaN, GaN, AlGaN or AlN, the channel layer comprises InGaN, InAlGaN, GaN or AlGaN, and the barrier layer comprises a first group III nitride.

* * * * *